(12) United States Patent
Juluri

(10) Patent No.: US 7,515,619 B2
(45) Date of Patent: Apr. 7, 2009

(54) LASER CONTROL CIRCUIT

(75) Inventor: Raghavendra V. Juluri, Pacifica, CA (US)

(73) Assignee: Intel Corporation, Santa Clara, CA (US)

( * ) Notice: Subject to any disclaimer, the term of this patent is extended or adjusted under 35 U.S.C. 154(b) by 368 days.

(21) Appl. No.: 11/165,270

(22) Filed: Jun. 22, 2005

(65) Prior Publication Data

US 2006/0291510 A1    Dec. 28, 2006

(51) Int. Cl.
*H01S 3/00* (2006.01)

(52) U.S. Cl. .............. 372/38.01; 372/38.02; 372/38.07; 372/38.09

(58) Field of Classification Search .... 372/38.01–38.09
See application file for complete search history.

(56) References Cited

U.S. PATENT DOCUMENTS

| | | | |
|---|---|---|---|
| 4,916,707 A * | 4/1990 | Rosenkranz | 372/38.09 |
| 5,019,769 A | 5/1991 | Levinson | |
| 5,073,838 A * | 12/1991 | Ames | 361/103 |
| 5,986,488 A * | 11/1999 | Merritt | 327/166 |
| 2004/0022285 A1 * | 2/2004 | Romm | 372/38.02 |
| 2004/0202210 A1 * | 10/2004 | Thornton | 372/34 |

* cited by examiner

*Primary Examiner*—Minsun Harvey
*Assistant Examiner*—Xnning Niu
(74) *Attorney, Agent, or Firm*—Blakely, Sokoloff, Taylor & Zafman LLP

(57) ABSTRACT

An apparatus and method to safely control the power output of a laser source. A power monitor is optically coupled to monitor a power output of laser source generating an optical signal. The power monitor is coupled to generate power feedback data indicative of the power output. A processor is coupled to control the power output of the laser source in real-time in response to the power feedback data from the power monitor.

7 Claims, 7 Drawing Sheets

LASER CONTROL CIRCUIT

TECHNICAL FIELD

This disclosure relates generally to lasers, and in particular but not exclusively, relates to controlling the output power of a laser with a processor.

BACKGROUND INFORMATION

Implementing laser eye safety for 850 nm semiconductor lasers poses a challenge. Semiconductor vertical cavity surface emitting lasers ("VCSELs") typically operate better—and with higher bandwidth—when biased at higher currents resulting in higher output powers. Often, the Class 1 Eye Safety threshold power rating is very close to the nominal operating power of semiconductor based transceivers. From a manufactures perspective, products bearing a Class 1 Eye Safety label have a competitive advantage over lesser rated products (e.g., Class 1 M Eye Safety label) in the marketplace.

One conventional approach limits power output to achieve the Class 1 Eye Safety rating by selecting a direct current ("DC") bias current value with sufficient safety margin such that an entire population of devices is guaranteed not to exceed output power safety limits designated by the Class 1 Eye Safety standard. As operating temperature of an optical source changes, this maximum DC bias current changes. Additionally, as semiconductor laser sources age, the maximum DC bias current for a given temperature also changes. Accordingly, the selection of an appropriate DC bias current value with sufficient safety margin for an entire population of laser sources must account for temperature and aging factors. The safety margins built-in to a selected DC bias current value necessarily compromises eye mask margin for adherence to eye safety standards. Eye mask margin is a measure of the fidelity of an optical signal and is directly correlated with signal bandwidth. FIG. 1 illustrates how eye mask margin increases with laser bias current.

Another conventional approach limits output power for adherence to eye safety standards using a current sensing resistor coupled in series with a laser driver of the laser source. This series coupled current sensing resistor feeds a comparator coupled to a reference level. When a signal from the current sensing resistor exceeds the reference level, the laser source is disabled or current limited. A variation of this technique includes a digital potentiometer to vary a trip threshold with temperature. However, in either case, the protection mechanism is based on laser bias current, which is not truly representative of output power—the factor by which Laser Eye Safety is measured. Laser bias current is not an accurate indicator of output power since the relationship between output power and bias current varies with age.

To adhere to Laser Eye Safety standards, while operating at optimum bandwidth, a semiconductor laser source should continuously operate as close as possible to the maximum allowable power output. To safely operate continuously near the power output safety limit, robust safety mechanisms should be in place to detect and act on eye safety violation conditions.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method for safely controlling the power output of a laser source are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
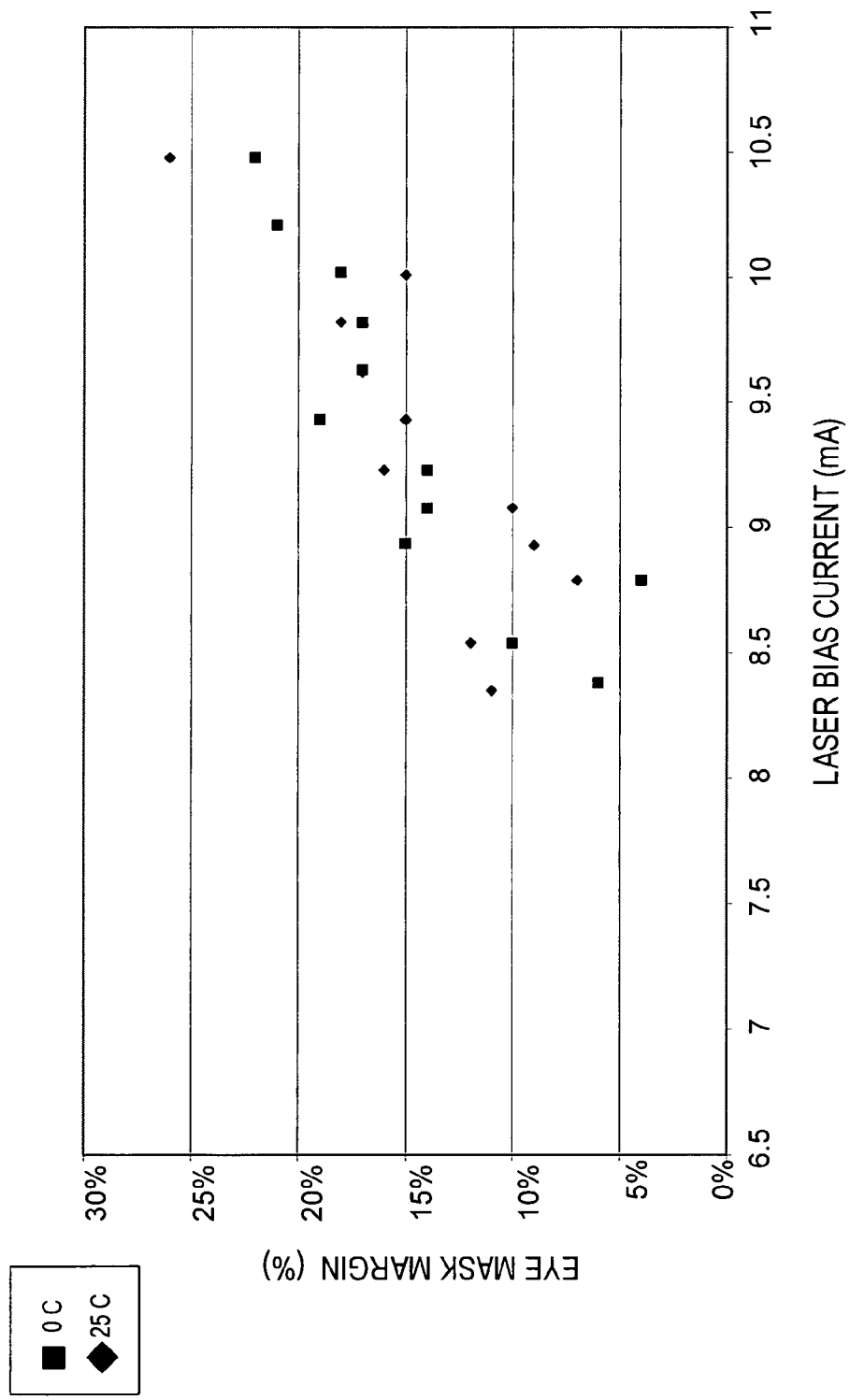
FIG. 1 is a line graph illustrating how eye mask margin of a laser source increases with increased bias current driving the laser source, in accordance with an embodiment of the invention.
Figure 2:
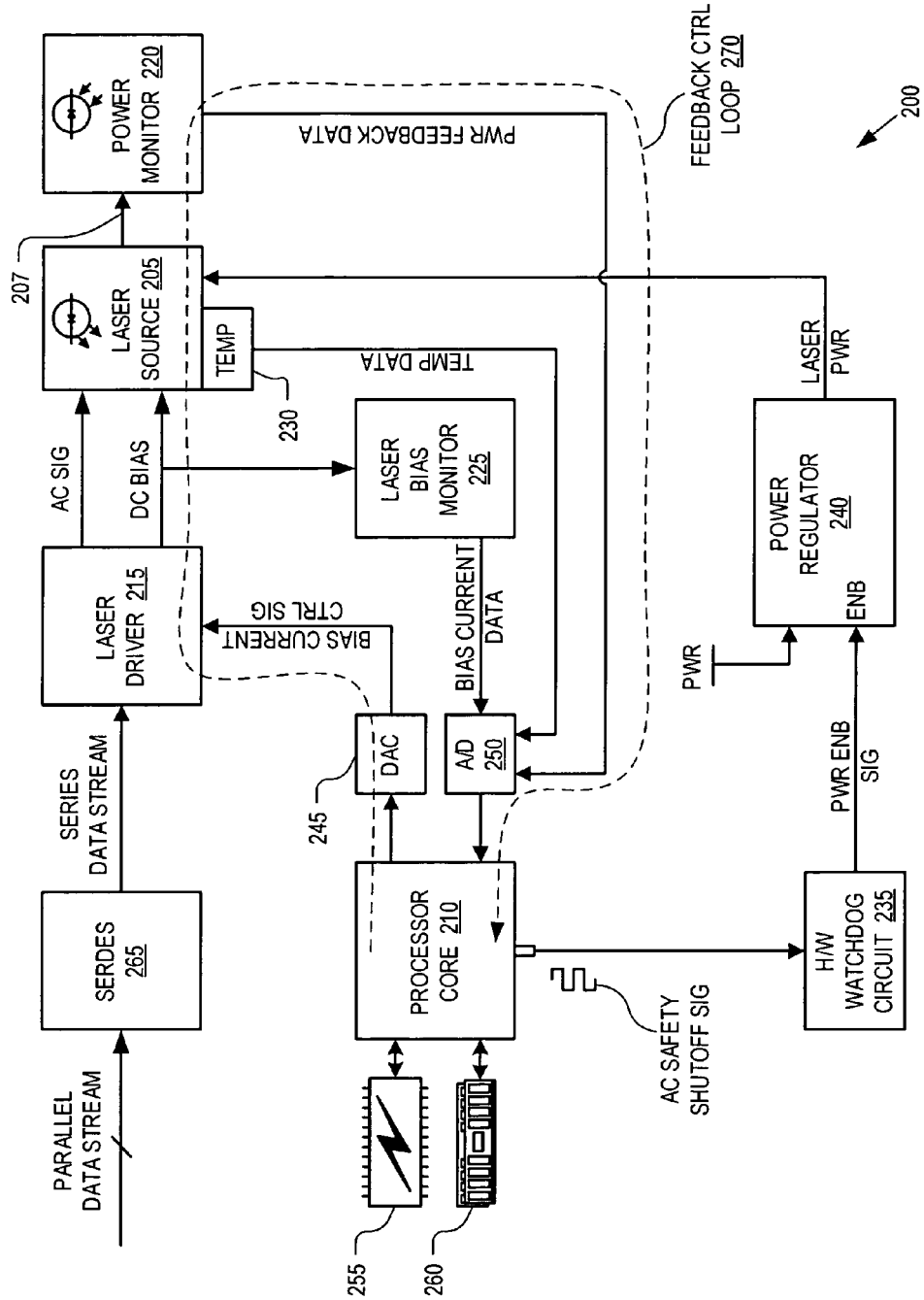
FIG. 2 is a functional block diagram illustrating control circuit architecture for safely controlling the power output of a laser source, in accordance with an embodiment of the invention.

FIG. 2 is a functional block diagram illustrating a control circuit 200 for safely controlling the power output of a laser source, in accordance with an embodiment of the invention. The illustrated embodiment of control circuit 200 includes a laser source 205, a processor core 210, laser driver 215, a power monitor 220, a laser bias monitor 225, a temperature sensor 230, a hardware watchdog circuit 235, a power regulator 240, a digital-to-analog converter ("DAC") 245, an analog-to-digital converter (A/D) 250, a firmware unit 255, and a random access memory ("RAM") unit 260. In the illustrated embodiment, laser driver 215 is coupled to a serialzer/deserializer ("SERDES") 265 to convert a parallel data stream to a series data stream.

Laser source 205 may represent any laser source including semiconductor laser sources such as laser diodes, vertical cavity surface emitting lasers ("VCSELs"), edge emitting laser sources, and the like. Laser source 205 generates an optical signal 207 in response to a direct current ("DC") bias current and an alternating current ("AC") signal current.

Laser driver 215 generates the DC bias current in response to a bias current control signal generated by processor core 210. Laser driver 215 generates the AC bias current in response to a data stream. In the illustrated embodiment, the data stream is a series data stream generated by SERDES 265 from a parallel data stream. In one embodiment, the AC bias current is used to modulate an optical signal onto an optical carrier wave generated in response to the DC bias current. Although the AC signal current and the DC bias current are illustrated as separate and distinct in FIG. 2 for the purposes of illustration, it should be appreciated that the AC signal current may in fact be superimposed over the DC bias current and together be coupled into laser source 205 as a single drive current. Accordingly, FIG. 2 is not intended to be a detailed schematic of control circuit 200, but rather a functional block diagram illustrating example architecture of control circuit 200.

Power monitor 220 is coupled to monitor an output power of laser source 205. In one embodiment, power monitor 220 is a photodiode optically coupled to receive a portion of optical signal 207. Based on the portion of optical signal 207 impingent upon an aperture of power monitor 220, power feedback data indicative of the power output of laser source 205 is generated by power monitor 220. The power feedback data is converted by A/D 250 from analog data to digital data and provided to processor core 210 as feedback for testing and controlling laser source 205. The bias current control signal, optical signal 207, and the power feedback data together form a feedback control loop 270 used by processor core 210 to accurately control the power output of laser source 205.

Temperature sensor 230 is thermally coupled to laser source 205 to monitor and measure the operating temperature of laser source 205 while lasing. Temperature sensor 230 generates temperature data indicative of the operating temperature. The temperature data is converted by A/D 250 from analog data to digital data and provided to processor core 210 as feedback for controlling laser source 205. Temperature sensor 230 may include any number of temperature sensing devices including thermocouples and the like. The bias current control signal, the temperature data, and the power feedback data together form another feedback control loop used by processor core 210 to control the power output of laser source 205 with precision in real-time over temperature.

Laser bias monitor 225 is coupled to laser driver 215 to monitor the DC bias current provided to laser source 205. Laser bias monitor 225 generates bias current data indicative of the DC bias current output from laser driver 215. The bias current data is converted by A/D 250 from analog data to digital data and provided to processor core 210 for testing and/or controlling laser source 205. In one embodiment, laser bias monitor 225 includes a current sensor.

Hardware watchdog circuit 235 is coupled to an input/output ("I/O") port of processor core 210 to receive an AC safety shutoff signal having a fixed frequency (e.g., 500 Hz) therefrom. Hardware watchdog circuit 235 generates a power enable signal in response while the AC safety shutoff signal oscillates within a limited or finite frequency range including the fixed frequency. The power enable signal is coupled into power regulator 240 to enable/disable laser power to laser source 205. Processor core 210 is configured to generate the AC safety shutoff signal while it is operating in a healthful state. If processor core 210 malfunctions, either due to corrupted software or damaged hardware, processor core 210 will no longer be capable of toggling its I/O port at the fixed frequency. In such an event, hardware watchdog circuit 235 will de-assert the power enable signal (discussed in detail below) causing power regulator 240 to disable the laser power and shut off laser source 205.

Processor core 210 is coupled to firmware unit 255 to load instructions therefrom. In one embodiment, processor core 210 loads programs and data from firmware unit 255 into RAM unit 260 and executes the programs from RAM unit 260. In other embodiments, processor core 210 may executes the programs directly from firmware unit 255, without need of RAM unit 260. RAM unit 260 may include any of dynamic RAM ("DRAM"), synchronous DRAM, ("SDRAM"), double data rate SDRAM ("DDR SDRAM"), static RAM ("SRAM"), or the like.

Processor core 210 may be integrated with one or more components of control circuit 200 onto one or more semiconductor dice and incorporated into a transmit optic sub-assembly ("TOSA"). For example, processor core 210, DAC 245, and A/D 250 may all be integrated into a single semiconductor die or wafer.

Processor core 210 is programmable to perform real-time feedback control of the output power of laser source 205, as well as, perform a number of laser safety tests to periodically validate the operational health of the various components of control circuit 200. As described below, processor core 210 is further configured to perform self diagnostic tests to validate itself and the programs/data it executes. Control circuit 200 provides a robust mechanism to accurately control the power output of laser source 205 in real-time during its operation, while at the same time periodically executing self diagnostics and laser safety tests. Control circuit 200 enables laser source 205 to be operated as close as possible to a selected output power (e.g., Class 1 Eye Safety threshold power rating) to achieve optimal eye mask margin without violating safety standards. Control circuit 200 provides robust safeguard mechanisms to prevent a safety standard violation in the event of a software/hardware failure. Since laser source 205 is operated under the control of processor core 210, the operating characteristics, bias current limits, output power limits, feedback loop coefficients, modulation voltage depth, and the like can be calibrated and adjusted on a per device basis, as opposed to selecting such values for an entire population of fabricated devices.

Figure 3:
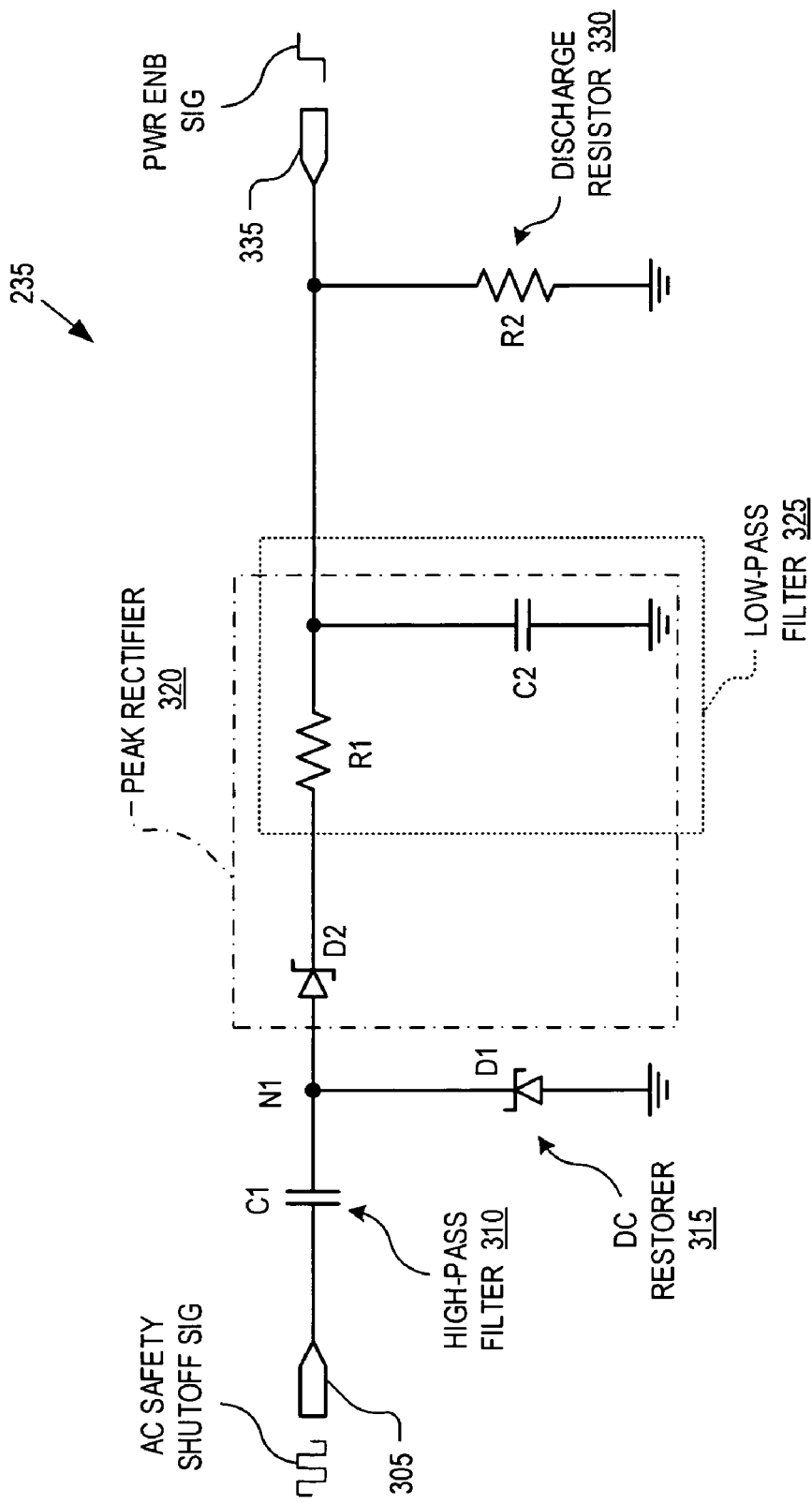
FIG. 3 is a circuit diagram of a hardware watchdog circuit for disabling a power regulator powering a laser source if a processor controlling the laser source fails, in accordance with an embodiment of the invention.

FIG. 3 is a circuit diagram of hardware watchdog circuit 235, in accordance with an embodiment of the invention. The illustrated embodiment of hardware watchdog circuit 235 includes an input port 305, a high-pass filter 310, a DC restorer 315, a peak rectifier 320, a low-pass filter 325, a discharge resistor 330, and an output port 335. Input port 305 couples to the I/O port of processor core 210 to receive the AC safety shutoff signal. Output port 335 couples to the enable input of power regulator 240 to enable/disable the laser power in response to the AC safety shutoff signal.

In the illustrated embodiment, high-pass filter 310 is a capacitor C1 (e.g., 1.0 µF) coupled in series between input port 305 and a node N1. The illustrated embodiment of DC restorer 315 is a diode D1 having its anode coupled to ground and its cathode coupled to node N1. The illustrated embodiment of peak rectifier 320 includes a diode D2 having its anode coupled to node N1, a resistor R1 (e.g., 4.75 kΩ) coupled between the cathode of diode D2 and output port 335, and a capacitor C2 (e.g., 4.7 µF) coupled between output port 335 and ground. In the illustrated embodiment, low-pass filter 325 is implemented as a subcomponent of peak rectifier 320 including resistor R1 and capacitor C2.

Hardware watchdog circuit 235 operates as follows. Input port 305 is coupled to receive the AC safety shutoff signal having a fixed frequency within a limited frequency range (band pass). High-pass filter 310 acts to pass high frequencies while blocking low frequencies. Accordingly, as long as the AC safety shutoff signal has a sufficiently high frequency (e.g., 300 Hz), then high-pass filter 310 will pass the signal. In the event of a failure of processor core 210, if the AC safety shutoff signal latches to a DC voltage (e.g., high or low logic state), then high-pass filter 310 will block the latched signal. DC restorer 315 acts to prevent node N1 from dropping below a ground potential (at least within the threshold voltage of diode D1).

Peak rectifier 320 acts to rectify the AC safety shutoff signal to generate a DC power enable signal at output port 335. Low-pass filter 325 acts to block high frequencies. In the event of failure, if processor core 210 happens to generate the AC safety shutoff signal at an unusually high frequency, then the voltage at output port 335 will slump over towards ground and therefore de-assert the power enable signal. The frequency at which low-pass filter 325 begins to slump over may be determined via appropriate selection the RC value of resistor R1 and capacitor C2. The combination of high-pass filter 310 and low-pass filer 325 act as a band-pass filter asserting the power enable signal while the AC safety shutoff signal oscillates within a limited frequency range. If during failure, the AC safety shutoff signal latches high, then the voltage on capacitor C2 is discharged through discharge resistor 330, de-asserting the power enable signal at output port 335.

The Class 1 Eye Safety standard makes provision for output power violation conditions, as long as those violation conditions do not persist for longer than one second. Actual measurements and simulation results of hardware watchdog circuit 235 have demonstrated that the power enable signal is asserted ≈153 ms after the AC safety shutoff signal begins to pulse and is de-asserted within 70 ms after the AC safety shutoff signal ceases to pulse.

Figure 4:
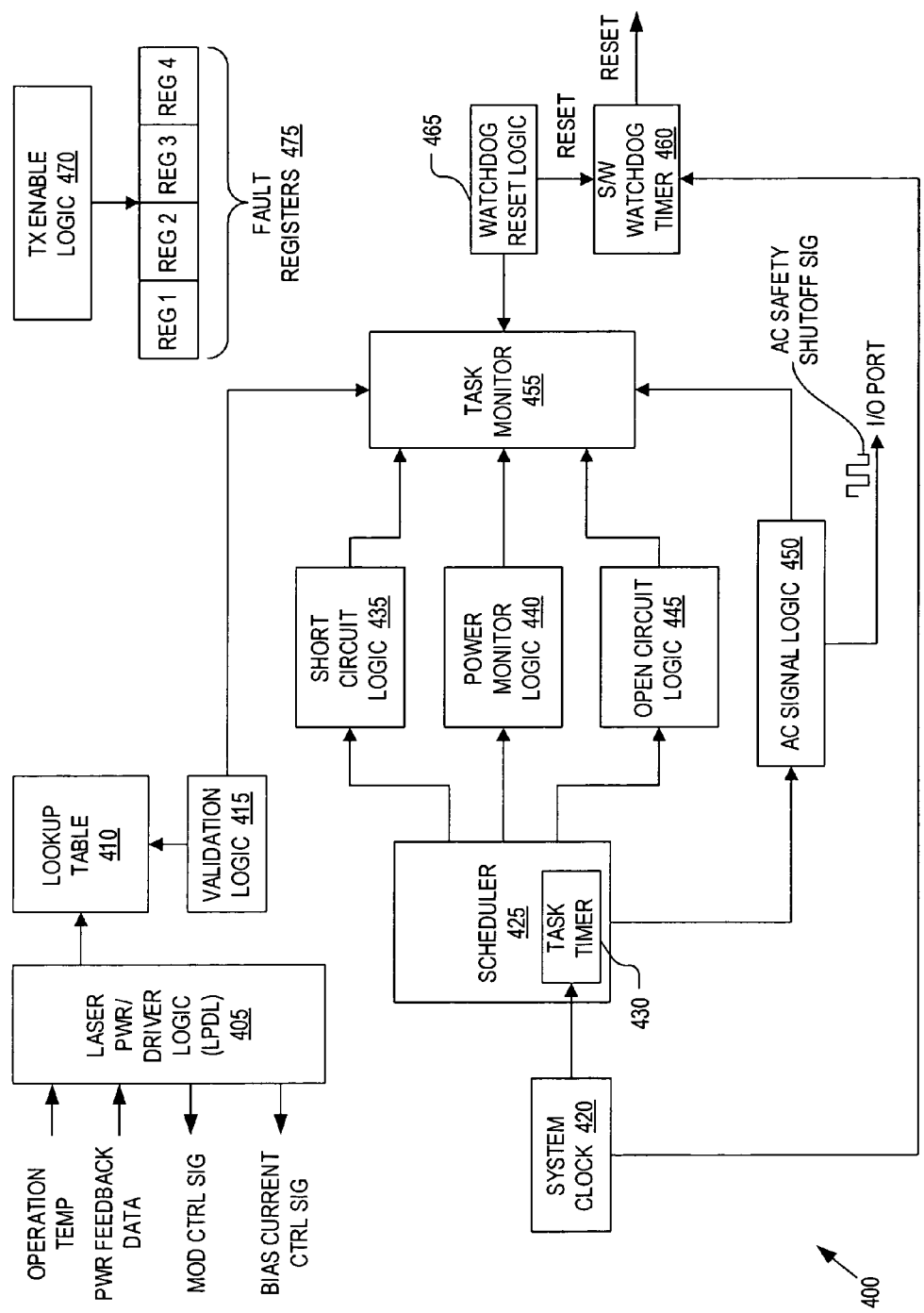
FIG. 4 is a functional block diagram illustrating control logic architecture for safely controlling the power output of a laser source, in accordance with an embodiment of the invention.

FIG. 4 is a functional block diagram illustrating control logic 400 for safely controlling the power output of laser source 205, in accordance with an embodiment of the invention. The illustrated embodiment of control logic 400 includes laser power/driver logic ("LPDL") 405, a lookup table 410, validation logic 415, a system clock 420, a scheduler 425, a task timer 430, short circuit logic 435, power monitor logic 440, open circuit logic 445, AC signal logic 450, a task monitor 455, a software watchdog timer 460, watchdog reset logic 465, transmit enable logic 470, and fault registers 475.

LPDL 405 is responsible for controlling the bias current of laser source 205. LPDL 405 receives as input the power feedback data generated by power monitor 220 and the temperature data generated by temperature sensor 230 and outputs the bias current control signal for controlling the DC bias current, based in part on this data. In one embodiment, LPDL 405 also generates a modulation control signal based on the temperature data. The modulation control signal may be provided to laser driver 215 to adjust the modulation depth of AC signal current based on the operational temperature of laser driver 215.

LPDL 405 controls the power output of laser source 205 with reference to lookup table 410. In one embodiment, lookup table 410 includes modulation depth data points (MD) and power set data points (PS) indexed to temperature data points (T). Table 1 illustrates a portion of an example lookup table 410.

TABLE 1

| Temperature Data Points | Modulation Depth Data Points | Power Set Data Points |
|---|---|---|
| $T_1$ | $MD_1$ | $PS_1$ |
| $T_2$ | $MD_2$ | $PS_2$ |
| ... | ... | ... |

In one embodiment, lookup table 410 may include other calibration data such as proportional, integral, and derivative ("PID") controller coefficients, gain constants, and the like. Lookup table 410 may be stored in firmware unit 255, loaded into RAM unit 260, and executed therefrom by processor core 210. In one embodiment, the data points of table 1 may be generated by calibration procedures executed on laser source 205 during fabrication and saved into firmware unit 255. Therefore, each fabricated instance of laser source 205 and/or a TOSA incorporating laser source 205, or other system, may be loaded with different calibration data points for use during operation. Subsequently, the data points of lookup table 410 may be referenced by LPDL 405 to control laser source 205 in real-time (described in detail with reference to FIG. 6). Furthermore, the calibration data may be updated at any time to retool laser source 205 for a different application or use, to achieve different performance characteristics, to account for changing safety standards, and the like.

During startup and operation, processor core 210 performs a variety of self-diagnostic tests to ensure safe operation and adherence to safety standard specifications. Validation logic 415, short circuit logic 435, power monitor logic 440, and open circuit logic 445 each perform a different such laser safety test. If any of the laser safety tests fails, then the associated laser safety test logic or task issues a laser shutdown command. Additionally, upon failure of a laser safety test, the associated task logic sets a failure flag in one of fault registers 475. The failure flag persists until a hard reset is issued or the failure flag is specifically cleared. AC signal logic 450 is responsible for toggling the I/O port of processor core 210 to generate the AC safety shutoff signal. If AC signal logic 450 fails to toggle the I/O port at a valid rate within the limited frequency range, then hardware watchdog circuit 235 disables the laser power as described above.

Scheduler 425 is responsible for scheduling the periodic operation of each task logic. Scheduler 425 uses task timer 430, incremented in response to system clock 420, to trigger execution at predetermined intervals. Upon execution by each task logic, the just-executed task reports its execution into task monitor 455. At set intervals, watchdog reset logic 465 inspects task monitor 455 to determine whether all laser safety tests and AC signal logic 450 have reported in. If so, then watchdog reset logic resets software watchdog timer 460. Upon reset, software watchdog timer 460 commences to count down from a preset value. If watchdog reset logic 465 fails to reset software watchdog timer 460 prior to expiration, then software watchdog timer 460 issues a soft reset of processor core 210, which in turn disables laser source 205 since the AC safety shutoff signal will cease to toggle.

Upon soft reset, transmit enable logic 470 inspects fault registers 475 to determine if a laser safety test failure occurred. If so, then transmit enable logic 470 will prevent laser source 205 from powering up. If not, then transmit enable logic 470 will allow power on of laser source 205. Transmit enable logic 470 prevents control circuit 200 from endlessly powering on laser source 205, determine that a fault has occurred due to failure of one of the laser safety tests and then power off the laser source 205. Rather, transmit enable logic 470 will prevent laser source 205 from powering on until the error condition is remedied and the failure flag cleared.

Figure 5:
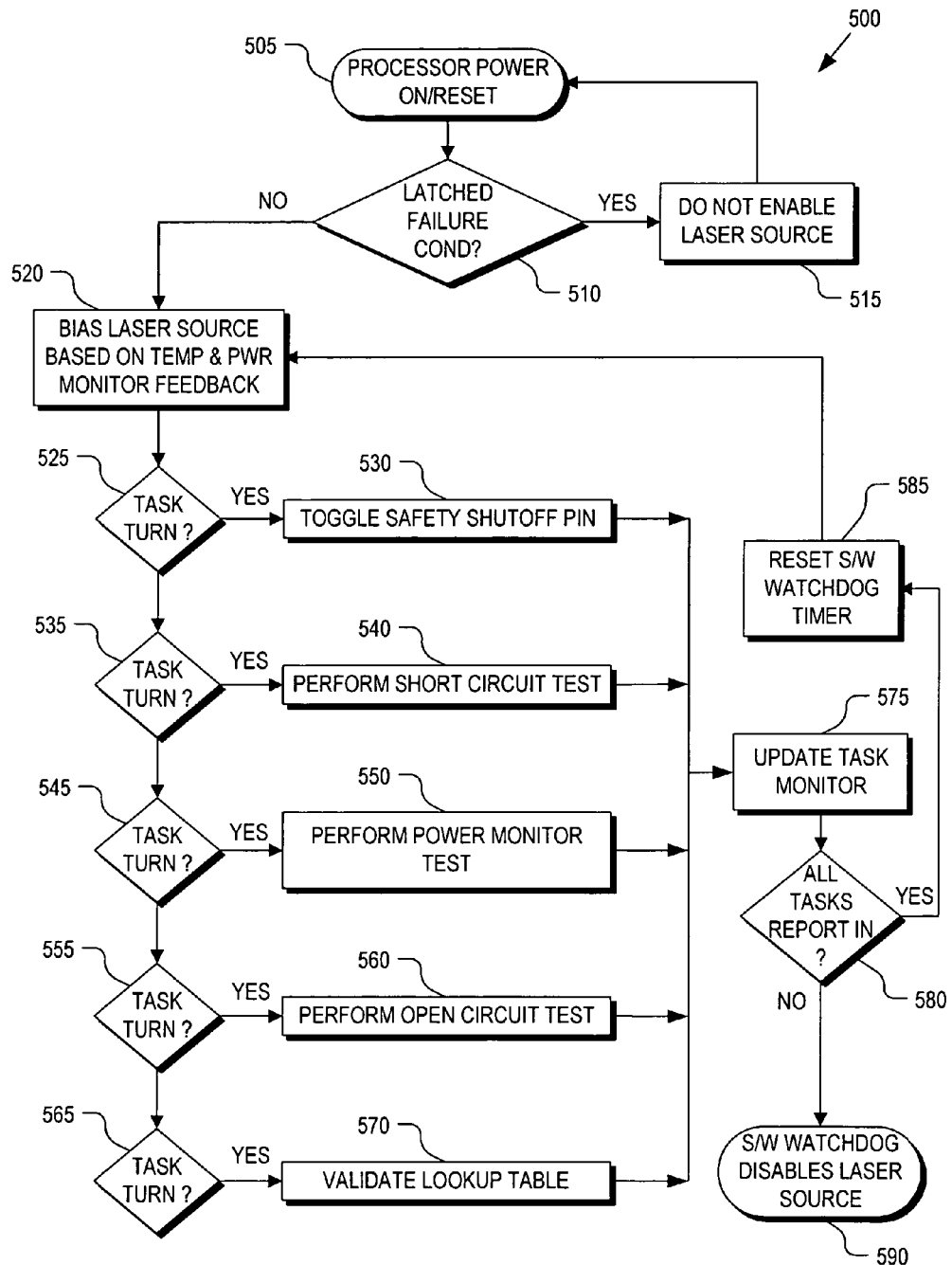
FIG. 5 is a flow chart illustrating operation of safety logic for verifying safe operation of a laser source, in accordance with an embodiment of the invention.

FIG. 5 is a flow chart illustrating a process 500 executed by control logic 400 to verify safe operation of laser source 205, in accordance with an embodiment of the invention. Process 500 is described with reference to FIGS. 2 and 4.

In a process block 505, processor core 210 is powered on or reset. In a decision block 510, transmit enable logic 470 inspects fault registers 475 to determine whether a persistent fault previously occurred. If one of fault registers 475 is set, indicating that one of the laser safety tests failed, then laser source 205 is not powered on (process block 515), and process 500 awaits clearance of fault bits. However, if none of fault registers 475 are set, then process 500 continues to a process block 520. Note, if processor core 205 was reset by software watchdog timer 406, indicating that one of the tasks did not report in to task monitor 455 in a timely manner, this does not necessary indicate that a laser safety test has failed. Rather, scheduler 425 may have failed or hung and therefore a simple soft reset is all that is needed to restart safe operation of laser source 205.

In process block 520, LPDL 405 biases laser source 205 based on the temperature data and the power feedback data with reference to lookup table 410. In a decision block 525, scheduler 425 determines whether to trigger AC signal logic 450 to execute. In one embodiment, scheduler 425 determines whether to trigger AC signal logic 450 with reference to task timer 430. To generate a 500 Hz AC safety shutoff signal, scheduler 425 triggers AC signal logic 450 every 1 ms. In response, AC signal logic 450 toggles the I/O port to generate the AC safety shutoff signal. AC safety shutoff signal is a sort of overall health indication of processor core 210 and control logic 400. In order to toggle the I/O port at a regular 500 Hz (or other fixed frequency), processor core 210 must be functional and the control logic 400 executing promptly in good order (e.g., not hung).

In a decision block 535, scheduler 425 determines whether to trigger short circuit logic 435 to execute. If so, then short circuit logic 435 performs a short circuit test to determine whether DAC 245, laser driver 215, or laser source 205 is short circuited (process block 540). In one embodiment, the short circuit test includes generating the bias current control signal by processor core 210 to stimulate a low level DC bias current from laser driver 215. Next, the power feedback data from power monitor 220 is inspected at processor core 210 to determine whether laser source 205 is generating greater output power than reasonably to be expected for the bias current control signal. Furthermore, the bias current data generated by laser bias monitor 225 is inspected to determine whether the DC bias current is greater than to be expected for the bias current control signal currently generated by processor core 210. If either of these two conditions exists, then a short circuit is determined to exist by short circuit logic 435. In one embodiment, short circuit logic 435 is executed every 20 ms and the short circuit logic test must fail 10 consecutive times before short circuit logic 435 will register a fail condition with fault registers 475 and issue a disable laser source command.

In a decision block 545, scheduler 425 determines whether to trigger power monitor logic 440 to execute. If so, then power monitor logic 440 performs a power monitor test to determine whether power monitor 220 is functioning correctly (process block 550). In one embodiment, the power monitor test includes driving a DC bias current through laser source 205 and monitoring the power feedback data to determine whether power monitor 220 is detecting output power above a threshold value. If the power feedback data indicates that power monitor 220 is not detecting the threshold value of output power, then power monitor logic 440 determines that power monitor 220 may be faulty. In one embodiment, power monitor logic 440 is executed once every 20 ms and the power monitor test must fail 15 consecutive times before power monitor logic 440 will register a fail condition with fault registers 475 and issue a disable laser source command.

In a decision block 555, scheduler 425 determines whether to trigger open circuit logic 445 to execute. If so, then open circuit logic 445 performs an open circuit test (process block 560) to determine whether an open circuit exists within the current drive path. In one embodiment, the open circuit test includes setting the bias current control signal to a maximum (or near maximum level) to stimulate laser source 205 at full power and monitoring the bias current data to determine whether laser bias monitor 225 is detecting a threshold DC bias current value. If the bias current data indicates that laser bias monitor 225 is not detecting a threshold level of DC bias current, then open circuit logic 445 determines that an open circuit may exist. In one embodiment, open circuit logic 445 is executed once every 20 ms and the open circuit test must fail 20 consecutive times before open circuit logic 445 will register a fail condition with fault registers 475 and issue a disable laser source command.

In a decision block 565, scheduler 425 determines whether to trigger validation logic 415 to execute. If so, then validation logic 415 performs a validation test on lookup table 410 (process block 570) to ensure lookup table 410 has not been corrupted. As described above, lookup table 410 may be store in firmware unit 255, loaded into RAM unit 260, and executed therefrom. During operation, it may be possible for the instance of lookup table 410 maintained in RAM unit 260 to become corrupted. In one embodiment, the validation test validates the data points of lookup table 410 by calculating a checksum for the instance of lookup table 410 and comparing the calculated checksum against a checksum stored in firmware unit 255. If the calculated checksum does not match the stored checksum, then validation logic 415 will determine that one or more data points within the instance of lookup table 410 stored in RAM unit 260 have been corrupted. In one embodiment, validation logic 415 is executed once every 100 ms and will register a fail condition with fault registers 475 upon a first mismatch between the stored checksum and the calculated checksum.

After executing each time, the various tasks (e.g., AC signal logic 450, short circuit logic 435, power monitor logic 440, open circuit logic 445, or validation logic 415) report the completion of their executing into task monitor 455 (process block 575). Periodically, watchdog reset logic 465 inspects task monitor 455 to determine whether any of the tasks have not been regularly executed as expected. In one embodiment, watchdog reset logic inspects task monitor 455 every 200 ms. Upon inspection, if watchdog reset logic 465 determines that all tasks have reported into task monitor 455 in a timely manner (decision block 580), then watchdog reset logic 465 resets software watchdog timer 460 (process block 585). However, if all tasks have not reported into task monitor 455 in a timely manner, then watchdog reset logic 465 does not reset software watchdog timer 460. Eventually, software watchdog timer 460 will expire without being reset and consequently issue a software reset command to processor core 210. The software reset command will disable laser source 205 since the AC safety shutoff signal will cease upon reset.

The actual execution of the tasks may be staggered even though many of them execute every 20 ms. However, since AC signal logic 450 may need to execute every 1 ms, there may be clock cycles where scheduler 425 schedules multiple tasks. To handle these overloaded clock cycles, an interrupt priority may be assigned to the various tasks. For example, AC signal logic 450 may be assigned a higher priority than the other tasks, since generation of the AC safety shutoff signal is time critical. In the event of scheduling conflicts, the task with the higher interrupt priority is executed first and the lower priority task is executed upon completion of the higher priority task.

Figure 6:
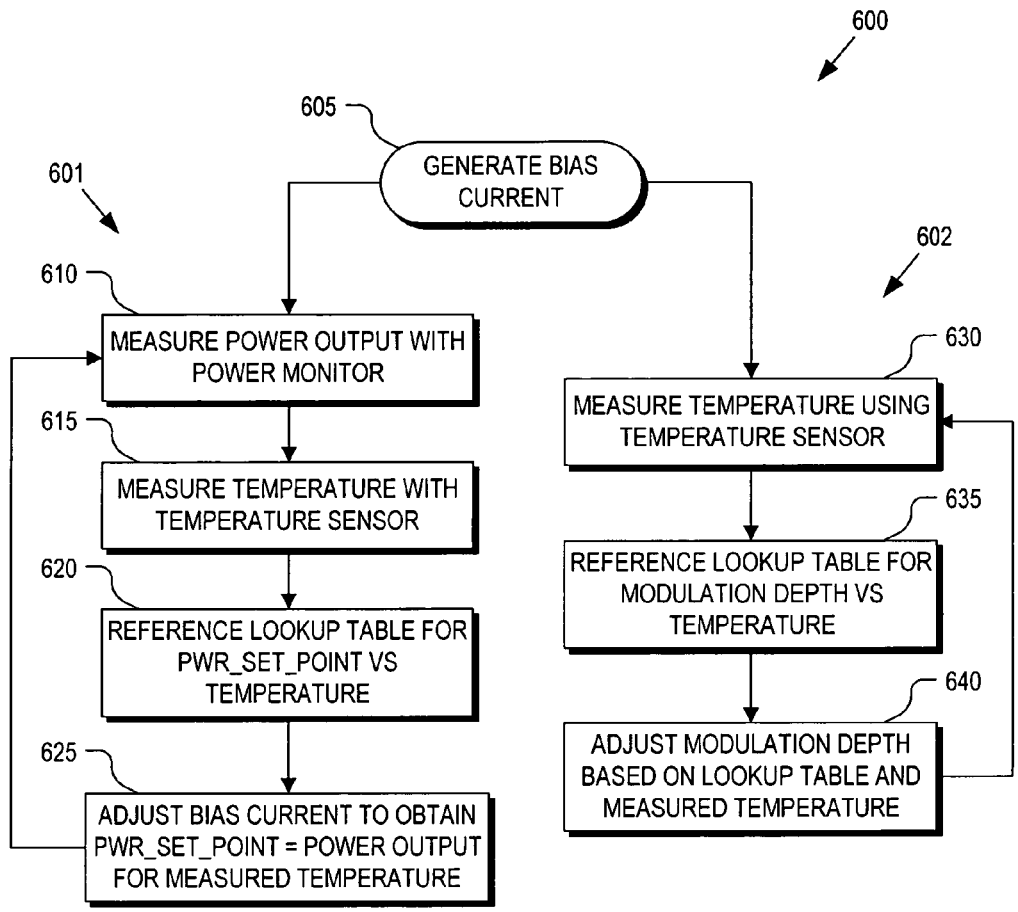
FIG. 6 is a flow chart illustrating a process for controlling the power output of a laser source in real-time using a processor, in accordance with an embodiment of the invention.

FIG. 6 is a flow chart illustrating a process 600 for controlling the power output of laser source 205 in real-time using processor core 210, in accordance with an embodiment of the invention. Process 600 illustrates two concurrently executing loops 601 and 602.

In a process block 605 an initial DC bias current is generated in response to the bias current control signal issued by processor core 210. Starting with loop 601, in a process block 610 power monitor 220 measures the output power of a portion of optical signal 207 impinging on its aperture. In response, power monitor 220 generates the power feedback data, which is related to the total power output of laser source 205. In a process block 615, temperature sensor 230 measures the operational temperature of laser source 205 and generates the temperature data in response thereto. In a process block 620, LPDL 405 references lookup table 410 to determine whether to increase or decrease the bias current control signal. In one embodiment, LPDL 405 indexes into lookup table 410 using the temperature data from temperature sensor 230. Based on the current temperature data being received, LPDL 405 determines the target power set data point PS to achieve for the current operating temperature of laser source 205. In a process block 625, LPDL 405 adjusts the bias current control signal to either increase or decrease the output power of laser source 205. LPDL 405 continues to adjust the bias current control signal to trend the power feedback data towards the power set data point PS corresponding to the temperature data point T matching the current temperature data. Loop 601 returns to process block 610 and continues therefrom as described above during operation of laser source 205.

Loop 602 executes in parallel with loop 601. In a process block 630, temperature sensor 230 measures the operational temperature of laser source 205 and generates the temperature data in response thereto. In a process block 635, LPDL 405 references lookup table 410 to determine the modulation depth data point MD corresponding to the current temperature data. Using the modulation depth data point MD, LPDL 405 instructs laser driver 215 to adjust the modulation depth of the AC signal current (process block 640). LPDL 405 uses the temperature data to continuously adjust the modulation depth with reference to lookup table 410.

Figure 7:
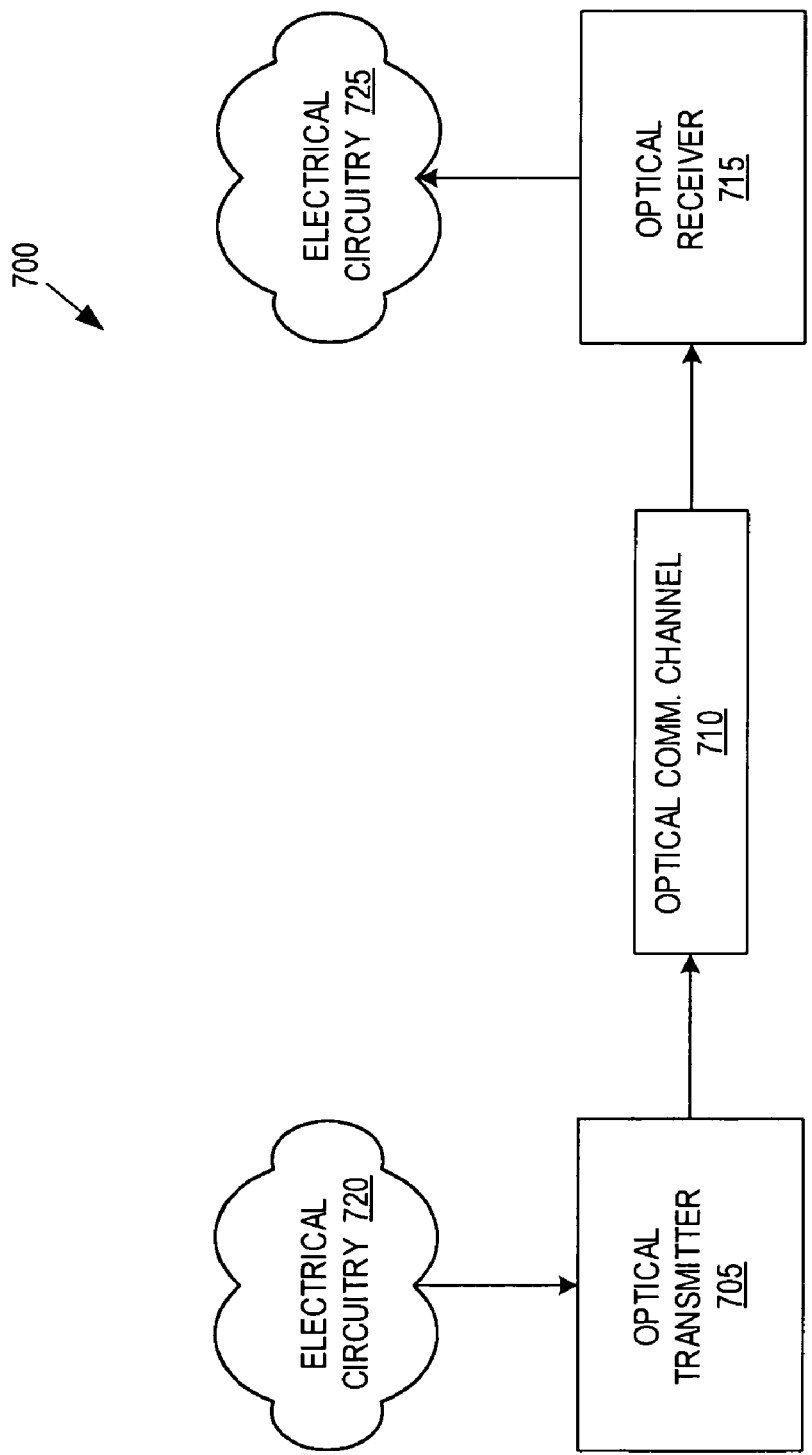
FIG. 7 is a block diagram illustrating a demonstrative communication system implemented with an embodiment of the invention.

FIG. 7 is a block diagram illustrating a demonstrative communication system 700 implemented with an embodiment of the invention. The illustrated embodiment of communication system 700 includes an optical transmitter 705, an optical communication channel 710, an optical receiver 715, and electrical circuitry 720 and 725.

In one embodiment, optical transmitter 705 may include control circuit 200 having control logic 400 operating thereon to safely and accurately control the power output of laser source 205. Electrical circuitry 720 may be coupled to SERDES 265 to provide a parallel data stream thereto. Optical transmitter 705 converts the electrical data to optical data using laser source 205 and launches optical signal 207 into optical communication channel 710. Optical communication channel 710 may include one or more optic fibers, waveguides, free space, or the like.

Optical receiver 715 is coupled to receive optical signal 207 from optical communication channel 710 and to convert optical signal 207 back into an electrical signal. The electrical signal is then provided to electrical circuitry 725 for processing thereon. It should be appreciated that both optical transmitter 705 and optical receiver 715 need not be unidirectional optical devices; rather both optical devices may be transceivers. In transceiver embodiments, both optical devices may include embodiments of control circuit 200 and control logic 400.

The processes 500 and 600 explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like. The order in which some or all of the process blocks appear in each process should not be deemed limiting. Rather, one of ordinary skill in the art having the benefit of the present disclosure will understand that some of the process blocks may be executed in a variety of orders not illustrated.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
   a laser source to generate an optical signal;
   a power monitor optically coupled to monitor a power output of the laser source and to generate power feedback data indicative of the power output;
   a processor coupled to control the power output of the laser source in real-time in response to the power feedback data from the power monitor;
   a power regulator coupled to provide power to the laser source during operation of the laser source; and
   a hardware watchdog circuit coupled to receive an alternating current ("AC") safety shutoff signal from the processor and further coupled to disable the power regulator when the AC safety shutoff signal is disrupted, wherein the hardware watchdog circuit includes:
      a high-pass filter coupled to receive the AC safety shutoff signal from the processor;
      a peak rectifier coupled to rectify the AC safety shutoff signal; and
      a discharge resistor coupled to discharge an output of the peak rectifier, if the AC safety shutoff signal fails.

2. The apparatus of claim 1, further comprising:
   a firmware unit coupled to the processor to store a lookup table, the lookup table including power data points indexed to temperature data points; and
   a temperature sensor thermally coupled to the laser source to measure an operating temperature of the laser source and coupled to generate temperature data indicative of the operating temperature to the laser source,
   wherein the processor is coupled in a feedback control loop with the laser source and power monitor to control the power output of the laser source based at least in part on the temperature data and with reference to the power data points indexed to the temperature data points of the firmware unit.

3. The apparatus of claim 1, wherein the hardware watchdog circuit comprises:
   a capacitor C1 coupled between an input and a node N1;
   a diode D1 coupled between node N1 and a ground node;
   a diode D2 having an anode coupled to node N1;
   a resistor R1 coupled between to a cathode of diode D2 and to an output;
   a capacitor C2 coupled between the ground node and the output; and
   a resistor R2 coupled between the ground node and the output.

4. The apparatus of claim 2, further comprising:
   a laser driver to drive the laser source with a DC bias current and an AC signal current, the processor coupled to the laser driver to control the DC bias current in real-time; and
   a laser bias monitor coupled to monitor the DC bias current and coupled to provide bias current data to the processor.

5. The apparatus of claim 1, wherein the laser source comprises a vertical cavity surface emitting laser ("VCSEL") and wherein the power monitor comprises a photo diode positioned to receive a portion of the optical signal to monitor the power output of the VCSEL.

6. An optical transmitter system, comprising:
   a laser source coupled to generate an optical signal in response to an electrical signal; and
   a control circuit to control the laser source, the control circuit including:
   a power monitor optically coupled to monitor the power output of the laser source and to generate power feedback data indicative of the power output;
   a processor coupled to control the power output of the laser source in real-time in response to the power feedback signal from the power monitor;
   a power regulator coupled to provide power to the laser source during operation of the laser source;
   a hardware watchdog circuit coupled to receive an alternating current ("AC") safety shutoff signal from the processor and further coupled to disable the power regulator when the AC safety shutoff signal is disrupted; and
   synchronous dynamic random access memory ("SDRAM") coupled to the processor to execute instruction therefrom,
   wherein the hardware watchdog circuit includes:
      a high-pass filter coupled to receive the AC safety shutoff signal from the processor;
      a peak rectifier coupled to rectify the AC safety shutoff signal; and
      a discharge resistor coupled to discharge an output of the peak rectifier, if the AC safety shutoff signal fails.

7. The optical transmitter system of claim 6, wherein the control circuit further includes:
   a firmware unit coupled to the processor to store a lookup table, the lookup table including power data points indexed to temperature data points; and
   a temperature sensor thermally coupled to the laser source to measure an operating temperature of the laser source and coupled to generate temperature data indicative of the operating temperature to the laser source,
   wherein the processor is coupled in a feedback control loop with the laser source and power monitor to control the power output of the laser source based at least in part on the temperature data and with reference to the power data points indexed to the temperature data points of the firmware unit.

* * * * *